United States Patent [19]

West

[11] Patent Number: 5,457,341
[45] Date of Patent: Oct. 10, 1995

[54] INTEGRATED CIRCUIT DEVICE AND MANUFACTURING METHOD USING PHOTORESIST LEAD COVERING

[75] Inventor: David W. West, Pembroker, Mass.

[73] Assignee: Texas Instruments Incorporated, Dallas, Tex.

[21] Appl. No.: 321,331

[22] Filed: Oct. 11, 1994

Related U.S. Application Data

[62] Division of Ser. No. 237,576, May 3, 1994.

[51] Int. Cl.$^6$ .......................... H01L 23/48; H01L 29/46; H01L 29/54; H01L 29/62
[52] U.S. Cl. ....................... 257/666; 257/668; 257/667
[58] Field of Search .................................... 257/666, 676, 257/667, 674, 668

[56] References Cited

U.S. PATENT DOCUMENTS

| | | | |
|---|---|---|---|
| 4,899,207 | 2/1990 | Hallowell et al. | 257/676 |
| 5,177,591 | 1/1993 | Emanuel | 257/666 |
| 5,294,827 | 3/1994 | McShane | 257/676 |

*Primary Examiner*—Sara W. Crane
*Assistant Examiner*—S. V. Clark
*Attorney, Agent, or Firm*—Warren L. Franz; W. James Brady, III; Richard L. Donaldson

[57] ABSTRACT

A method of making an integrated circuit (IC) device comprises the steps of providing (300) at least one lead frame (10) comprising a plurality of leads (14), laminating (302) the lead frame (10) with a photoresist, exposing (304) a portion of the photoresist to impose a pattern on the photoresist (10), and developing (306) the photoresist on lead frame (10), such that the photoresist produces a pair of strips and forms non-electrically conductive bonds (30, 32) between leads (14). Further, an IC device comprises a plurality of leads (14) extending from a lead frame (10). The leads (14) comprise an inner lead portion (26), a middle lead portion (27) and an outer lead portion (28). A photoresist is overlaid onto the leads (14). The photoresist comprises an inner strip (30) disposed across the plurality of leads (14) between the inner lead portion (26) and the middle lead portion (27) and an outer strip (32) disposed across the plurality of leads (14) between the outer lead portion (28) and the middle lead portion (27). The photoresist inhibits cavity molding (42) plastic from seeping onto inner lead portion (26) or outer lead portion (28) and creates a non-electrically conductive bond between the leads (14).

7 Claims, 3 Drawing Sheets

5,457,341

INTEGRATED CIRCUIT DEVICE AND MANUFACTURING METHOD USING PHOTORESIST LEAD COVERING

This is a division of application Ser. No. 08/237,576, filed May 3, 1994.

TECHNICAL FIELD OF THE INVENTION

This invention relates to the field of integrated circuit (IC) devices and in particular, to a method for making IC devices using a photoresist lead covering.

BACKGROUND OF THE INVENTION

Most IC devices have a support structure or lead frame having a plurality of leads extending toward the center of the lead frame, at which a bar pad is typically disposed. The bar pad may be attached to the lead frame structure by at least one tie bar. The leads are joined by at least one dam bar. Dam bars keep the leads connected to the lead frame during an IC device assembly process while preparing to mount a chip, e.g., a semiconductor chip, on the bar pad. The dam bar(s) referred to above are generally provided at the outer ends of the leads. Dam bar(s) are removed by a punch or die tooling operation before the assembly process is completed.

Lead frames may be of various sizes depending upon the size of the chip and the number of wire bonds that are made between the leads and the bond pads of the chip. Moreover, leads to be connected to the chip are spaced around the chip, such that they are adequately sized and sufficiently spaced to receive a wire bond from the chip. For this reason, lead frames commonly may have connecting leads on at least two sides of the bar pad, and many lead frames have connecting leads on four sides. Lead frames are usually manufactured in long strips which-may include many individual units. The long strips are wide enough to accommodate from one to as many as five lead frames, for example.

Before the leads are connected to the chip, a cavity mold may be provided to surround and protect the area in which the chip and the wire bonds are disposed. Such cavity molds are generally manufactured by molding, .e.g., injection molding, a plastic to cover the middle portion of the leads. When the plastic hardens, the mold may also sere as a support structure for the IC device. The mold, however, is placed in the middle portion of the lead because the inner portion of the leads, i.e., the lead fingers, receive the wire bonds from the chip's bond pads and the outer lead ends are used to join the IC device to other components. If plastic covers the inner or outer portions of the leads, electrical connections with those portions of the lead are inhibited.

SUMMARY OF THE INVENTION

Accordingly, a need has arisen for a method to bond the leads of a lead frame in an electrically non-conductive way during the assembly process of the IC device. Further, a need has arisen for a method which creates a boundary around the middle portion of the lead. Thus, when the plastic of the cavity mold is molded by, for example, injection molding, the plastic will be constrained to or inhibited from seeping out of the middle portion of the leads. Further, IC devices made by such methods are more sturdy and are less susceptible to damage caused to the leads during IC device assembly processes.

According to the present invention, a method for making an IC device comprises the steps of providing at least one lead frame comprising a plurality of leads, laminating the lead frame with a photoresist, exposing a portion of the photoresist to impose a pattern on the photoresist, and developing the photoresist on the lead frame, such that the photoresist produces at least a pair of strips which form electrically non-conductive bonds between the leads.

Also according to the present invention, an IC device comprises a plurality of leads extending from a lead frame. The leads comprise an inner lead portion, a middle lead portion, and an outer lead portion. A photoresist is overlaid onto the leads. The photoresist comprises an inner strip disposed across the plurality of leads between the inner lead portion and the middle lead portion and an outer strip disposed across the plurality of leads between the outer lead portion and the middle lead portion. A cavity mold is molded, e.g., injection molded, from a polymer, such as plastic, and is provided over the photoresist and the middle lead portion. The strips inhibit the cavity mold plastic from seeping onto either the inner or outer lead portions. The lead frame also comprises a bar pad for receiving at least one chip which is connected to the leads via wire bonds.

A technical advantage of the present invention is that the photoresist creates a narrow barrier which inhibits the flow of the cavity mold polymer during cavity molding. Further, the present invention provides a substantially rigid, picture frame-type structure to hold the plurality of leads together and at a sufficient separation with respect to one another to prevent interference between the pluralities of leads and wire bonds. This picture-frame structure is provided by at least one electrically non-conductive continuous strip. Thus, during molding, damage to the leads from the molding process is minimized.

DETAILED DESCRIPTION OF THE INVENTION

Figure 1:
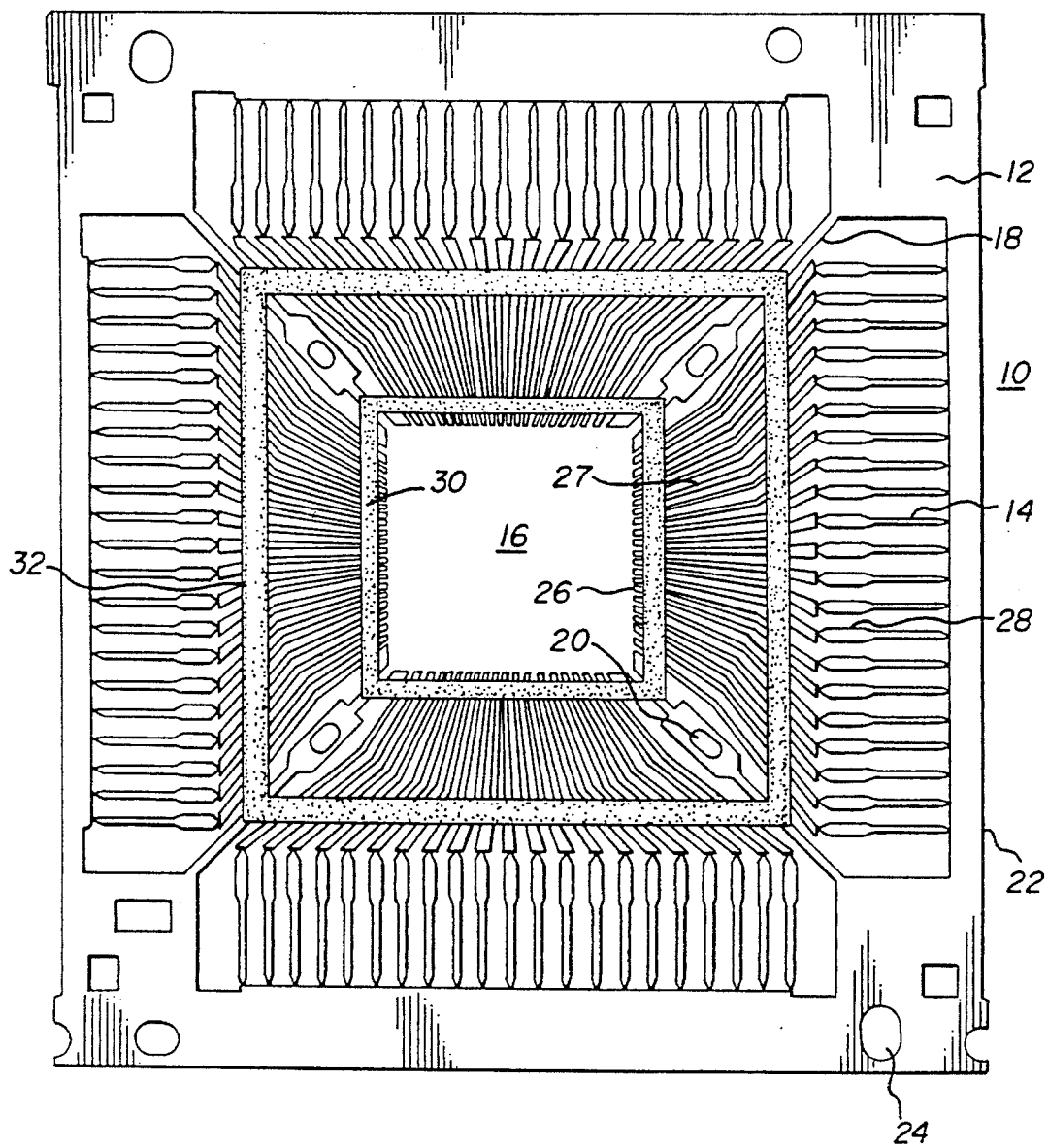
FIG. 1 depicts an overhead view of a lead frame having a photoresist pattern according to the present invention.

FIG. 1 depicts a lead frame 10. Lead frame 10 has a frame structure 12 that supports the outer ends of a plurality of leads 14 of lead frame 10. A bar pad 16 is connected to frame structure 12 by tie bars 18. Tie bars 18 include a modified section 20 to permit separation of each tie bar 18 into two parts. Leads 14 extend between bar pad 16 and frame structure 12.

FIG. 1 further depicts a lead frame 10 having four sides surrounding bar pad 16, on which leads 14 are provided. For example, lead frame 10 may have 208 leads 14 with 52 leads on each side of lead frame 10. The number of sides of lead frame 10 on which leads 14 are provided, the total number of leads 14, and the number of leads 14 on each side of lead frame 10 may vary depending on the type or size of chip, or both, which is mounted on bar pad 16.

Lead frame 10 may be produced by either etching or stamping. A stamping machine is generally more expensive, than establishment of an etching process. Nevertheless, although etching permits the manufacture of customized lead frames, etching generally does not provide as rapid a method of lead frame reproduction at as low a per unit cost, as stamping.

The outer ends of leads 14 are joined via dam bars, e.g., carrier rails 22, disposed on each of the four sides of lead frame 10. A plurality of guide holes 24 is disposed in carrier rails 22. Guide holes 24 assist in positioning and advancing lead frame 10 through the manufacturing, e.g., stamping or etching, process. Each lead 14 comprises an inner lead portion 26, a middle lead portion 27, and an outer lead portion 28. Leads 14 fan out from bar pad 16. At their outer extremes, however, leads 14 are substantially parallel and substantially equally spaced. Outer lead portions 28 may be used to connect the IC device to other IC devices via a circuit board.

According to the present invention, in order to provide an electrically non-conductive bond between leads 14, so that carrier rails 22 may be removed and leads 14 may be separated from bar pad 16, an inner strip 30 and an outer strip 32 are provided between inner lead portion 26 and middle lead portion 27 and between middle lead portion 27 and outer lead portion 28, respectively. Inner strip 30 and outer strip 32 are photoresists which are provided according to a method described below.

Figure 3:
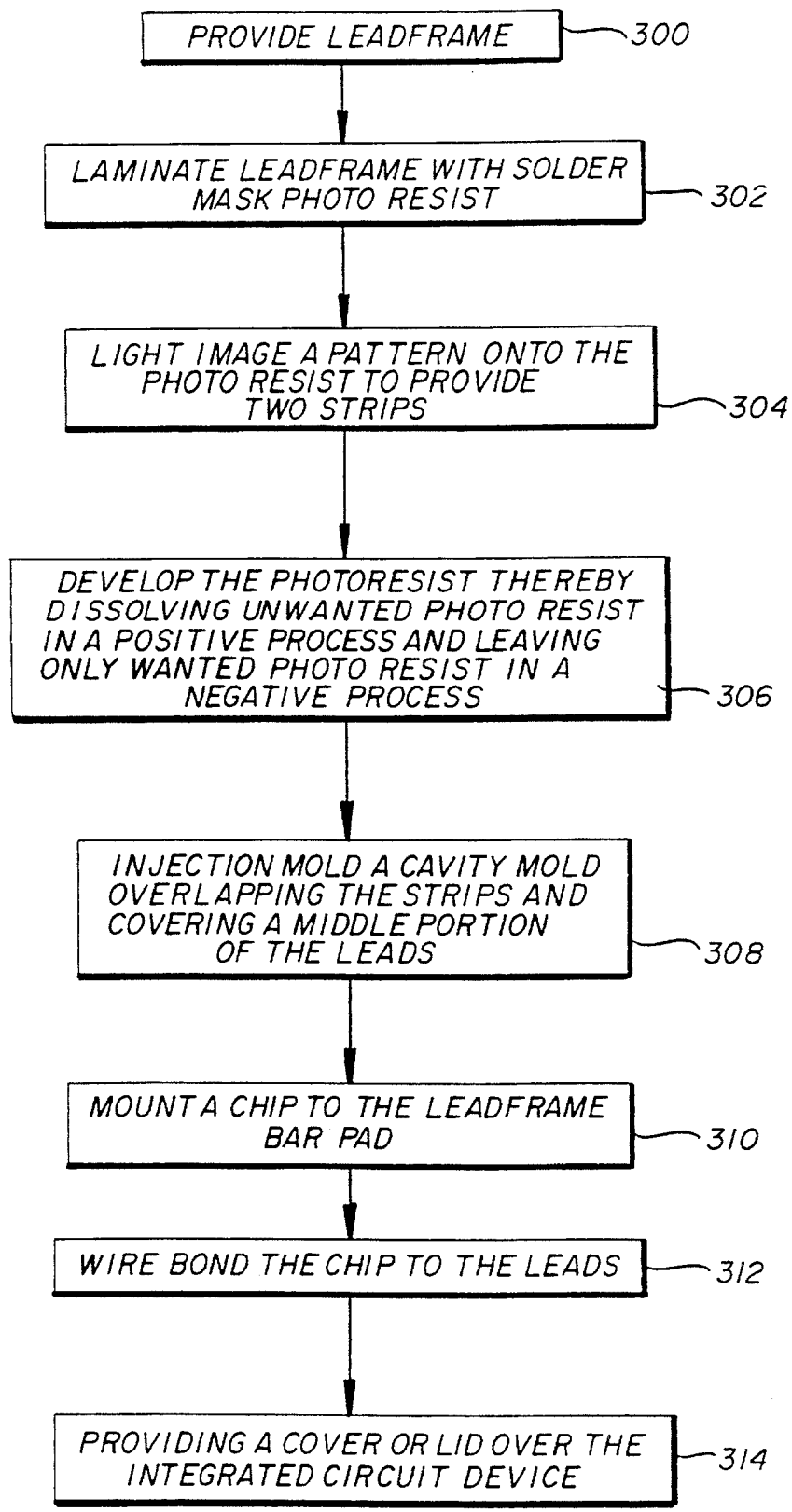
FIG. 3 is a flow diagram of a method of making an IC device according to the present invention.

A method for applying inner strip 30 and outer strip 32 and for providing an IC device is depicted in FIG. 3. In step 300, lead frame 10 is provided. Lead frame 10 then is laminated with a soldermask photoresist (step 302). Light imaging is performed to expose all but two strip portions, inner strip 30 and outer strip 32 (for a negative working photoresist) (step 304). The photoresist may then be developed to reveal inner strip 30 and outer strip 32 and to remove, e.g., dissolve, the unwanted portions of the photoresist (step 306). Of course, the method may also be accomplished using a positive working photoresist. After development, a plastic is injected into a mold to form a cavity mold (not shown) to overlap strips 30 and 32 and middle lead portion 27 (step 308). Once the cavity mold has been formed, a chip (not shown) is mounted on, e.g., epoxied to, bar pad 16 (step 310). The chip is then wired to leads 14 by means of wire bonds (step 312). Additionally, a cover or lid, or both, (not shown) may be provided (step 314).

In the method of the present invention, a plurality of lead frames 10 may be connected together for purposes of conveying them through these various steps. Therefore, a chain of lead frames 10 about 750 feet (about 230 m) in length may be formed. In addition, a carrier material (not shown) measuring about 750 feet (230 m) by about 0.01 inch (0.25 cm) by about 2 inches (5 cm) may be used to support lead frames 10. Further, a soldermask photoresist measuring about 750 feet (230 m) by about 1.75 inches (4.45 cm) by about 0.003 inches (0.008 cm) may be used as a photoresist laminate.

In step 300, lead frames 10 may be Palladium (Pd) plated etched lead frames, for example. Other lead frames which are suitable for use in an IC device, such as lead frames manufactured from copper, iron, silver, nickel, or alloys thereof, may also be provided. Moreover, the carrier material may be a copper stamped material, for example. Other carrier materials also may be used.

In step 302, the soldermask photoresist is laminated onto lead frame 10. The soldermask photoresist may have a thickness in a range of about 0.003 to 0.004 inches (0.008 to 0.01 cm). The soldermask may comprise a photoimagable dryfilm soldermask photoresist, such as the 8100 Series Photopolymer film sold under the trademark VACREL by DuPont Corporation. Such dryfilm type soldermasks generally comprise three layers: (1) a polyester support sheet of about 1 mil thickness (0.001 inches/0.025 cm), which serves as a top layer; (2) a photopolymer layer, which is the actual photoresist material; and (3) a polyolefin release sheet of about 1 mil thickness (0.001 inches/0.025 cm), which serves as the bottom layer. The soldermask alone has a thickness of about 0.003 inches (0.008 cm) and is applied using a hot roll technique at a temperature of about 228° F. (109° C.). The rate at which the soldermask is applied may be controlled by the pressure of a spring to a speed of about 6.2 feet per minute (1.9 m/min.). A second layer of soldermask may also be used after removing the polyester typically mylar top sheet. If a second layer is applied, the hot roll process again may be used to apply the second layer. However, this second layer is applied at a slightly lower hot roll temperature of about 203° F. (95° C.). The rate of application again may be controlled by spring pressure at an average application speed of about 6.2 feet per minute (1.9 m/min.).

Alternatively, the soldermask photoresist may be a KM dry film soldermask sold under the trademark DYNAMASK by Dynachem Electronic Materials, a subsidiary of Morton International. DYNAMASK soldermask is an aqueous processible, dry film photopolymer soldermask, utilizing epoxy chemical-materials having electrical insulation, chemical resistance, and dimensional stability properties. In addition, the photoresist may be laminated to lead frame 10 by means of vacuum lamination equipment, for example, the Dynachem Vacuum Applicator or the DuPont SMVL Vacuum Laminator.

Vacuum lamination with the Dynachem laminant may be performed at a platen temperature in a range of about 132° to 152° F. (55° to 65° C.). The lamination process lasts in the range of about 35 to 55 seconds. The actual duration may vary with the vacuum lamination temperature. After lamination of lead frame 10, the soldermask is allowed to cool, which commonly takes about fifteen to thirty minutes, but may take as long as about two hours.

Vacuum lamination of the DuPont laminant occurs in a temperature range of about 160° to 177° F. (71° to 77° C.) and lasts for about 50 to 70 seconds. Again, after vacuum lamination, this laminant is allowed to cool for about 8 hours, however, cooling may take as little as about 1 hour or as long as about 72 hours. Although either the DuPont or Dynachem laminants may be used, other similar laminants also may be suitable. Further, other lamination processes may be used which suitably apply a laminant onto lead frame 10.

As noted above, either negative or positive working photoresists may be used to produce strips 30 and 32. Negative working photoresists react under exposure to light, e.g., ultraviolet light, to become less soluble in a solvent, i.e., the development solution of step 306. For example, negative working photoresists may include polyisoprene derivatives. Polyisoprene is the polymer which forms the basis for natural latex rubber. This polymer is cyclized to reduce its molecular weight, which makes it suitable for use as a photoresist. The exposure of a cyclized polymer to light causes cross-linking between molecules, thus increasing the molecular weight of the resulting molecules and also making the polymer more resistant to attack by the solvent.

Negative working photoresists are highly resistant to both acid and alkaline solutions, as well as oxidizing agents. A given thickness of a negative working photoresist may be more resistant than the same thickness of a positive working photoresist. Often with a negative working photoresist, a sensitizer is used to increase the amount of exposure time during which the cyclized reaction occurs. Cyclized rubber is a hydrocarbon and, therefore, the developer solution may be a type of hydrocarbon solvent.

Positive working photoresists react to the light, e,g., ultraviolet light, by becoming more soluble when placed in a solvent. Generally, positive working photoresists tend to be more accurate than negative working photoresists. The resins used in positive working photoresists are generally soluble in strongly alkaline solutions and develop in mildly alkaline solutions. These resins are generally of low molecular weight, which ensures that they develop properly in the solvent. Like negative working photoresists, a sensitizer may be used with positive working photoresists. Moreover, suitable solvents for positive working photoresists include Cellosolve, methyl Cellosolve, or Cellosolve acetate, for example.

Usually, a predetermined thickness is applied when using a dryfilm photoresist. However, such dryfilm photoresists also may be layered. Alternatively, a liquid photoimagable soldermask photoresist may be applied. If a liquid photoresist is applied, equipment is used to roll, spray, or electrophereticly or spin apply the liquid to the surface of lead frame 10. This equipment is designed to place a uniform thickness of liquid coating on the surface of lead frame 10. Further, although a specific soldermask photoresist has been described, common photoresists, such as those employed to image lead frames 10 for chemical etching, may also be used.

After lead frame 10 has been laminated with a photoresist, inner and outer strips 30 and 32 are provided as depicted in FIG. 1. Light imaging is performed to create, e.g., expose, these strips 30 and 32. Depending upon the type of photoresist selected, i.e., either negative or positive working, a phototool or mask either exposes or covers portions of lead frame 10. For example, if a negative working photoresist is employed, a phototool may be used to expose two strip portions of the photoresist in the shape of inner strip 30 and outer strip 32. If a positive working photoresist is employed, however, the phototool may cover the two strip portions during exposure of the photoresist to leave inner strip 30 and outer strip 32 after developing.

The phototool may be about 9.5 inches (24.1 cm) by about 6.5 inches (16.5 cm) by about 0.19 inches (0.5 cm) in dimension with a plastic diazo film overlaid thereon. The plastic film may be cut, such that the desired pattern is exposed when light passes through the phototool. Two tooling holes may be drilled through the top of such a phototool to accept pilot pins having a diameter of about 0.057 inches (0.145 cm) and bushings. These pins may be used to index the phototool onto lead frame 10 during exposure. Alternatively, the phototool may be made from a sheet of glass having a negative of the desired image darkened onto it. In addition, a mylar film emulsion phototool may be employed also with a negative of the desired image darkened onto the mylar. In either the glass or mylar phototool, a negative image of the desired pattern is projected on the photoresist when light passes through the phototool.

After using the pins and bushings to properly position lead frame 10 under the phototool, lead frame 16 then may be exposed to light, such as ultraviolet light at an intensity of about 13 mW/cm$^2$. An exposure time of about 12.5 seconds results in a total exposure dose of about 162.5 mJ/cm$^2$. Other exposure doses would result from varying the intensity or the duration of exposure. After exposure of the photoresist, the desired pattern may then be produced by developing the photoresist using a known photoresist development technique.

Development includes passing the photoresist through an about 1% by weight solution of Potassium Carbonate at a temperature of about 95° F. (35° C.) at a speed of about 1.2 feet per minute (0.3 m/min.). The total residence of each lead frame 10 in the solution is about 3.2 minutes. Therefore, development of the photoresist yields inner strip 30 and outer strip 32, each of which is continuous and has a thickness of about 0.001 inches (0.025 cm).

After development, a cure process may be employed to solidify the soldermask. Curing may occur by passing lead frames 10 through a chamber in which an ultraviolet (UV) lamp at about 200 Watts/in. (80 Watts/cm) is operating. Alternatively, a Standard PC-130 type UV bulb may be used which provides about 4 J/cm$^2$. Lead flames 10 may be passed through such a curing chamber at a speed of about 1.4 yards per minute (1.3 m/min.), for example. After UV lamp treatment, lead frames 10 may be baked in a forced air oven for about one hour at a temperature in the range of about 284° to 302° F. (140° to 150° C.). Duration of the baking and UV exposure may vary depending upon lamp type and oven temperature.

Once the soldermask has been developed and the undesirable portions of the photoresist have been dissolved from lead frame 10, lead frames 10 then may be wound onto reels having an outer diameter of about 2.5 feet (0.8 m) and an inner diameter of about 1.8 feet (0.6 m). A paper inner leaf is inserted between the wraps on the reel to protect lead frames 10. Such reels hold about 750 feet (230 m) of lead frames 10. Lead flames 10 may be spot electroplated with palladium or silver or a copper or silver strike may be applied either before or after the photoresist is applied. Because the photoresist is an insulator, electroplating will not effect the area coated with the photoresist.

After processing, lead flames 10 are cut into strips of lead frame lengths comprising five or six lead flames 10. A cardboard interleaf (not shown) then is placed between lead flames 10. In this form, lead flames 10 may be transferred, if, for example, further processing or chip mounting is to occur at another site.

When the chip (not shown) is added to lead frame 10, leads 14 are detached from bar pad 16, but tie bars 18 remain attached to provide a support for bar pad 16. A punch then may be used to offset or downset bar pad 16, so that it is depressed below, the planar level of leads 14. The depth of downset or offset is determined by the height of the chip.

Throughout this method, lead frames 10 may be passed through the various exposure and development processes by means of at least one of carrier rails 22 using holes 24 which are formed, e.g., etched or stamped, in carrier rails 22. After assembly of the IC device is complete, the pair of carrier rails 22 may be trimmed from the opposite sides of lead frames 10.

Figure 2:
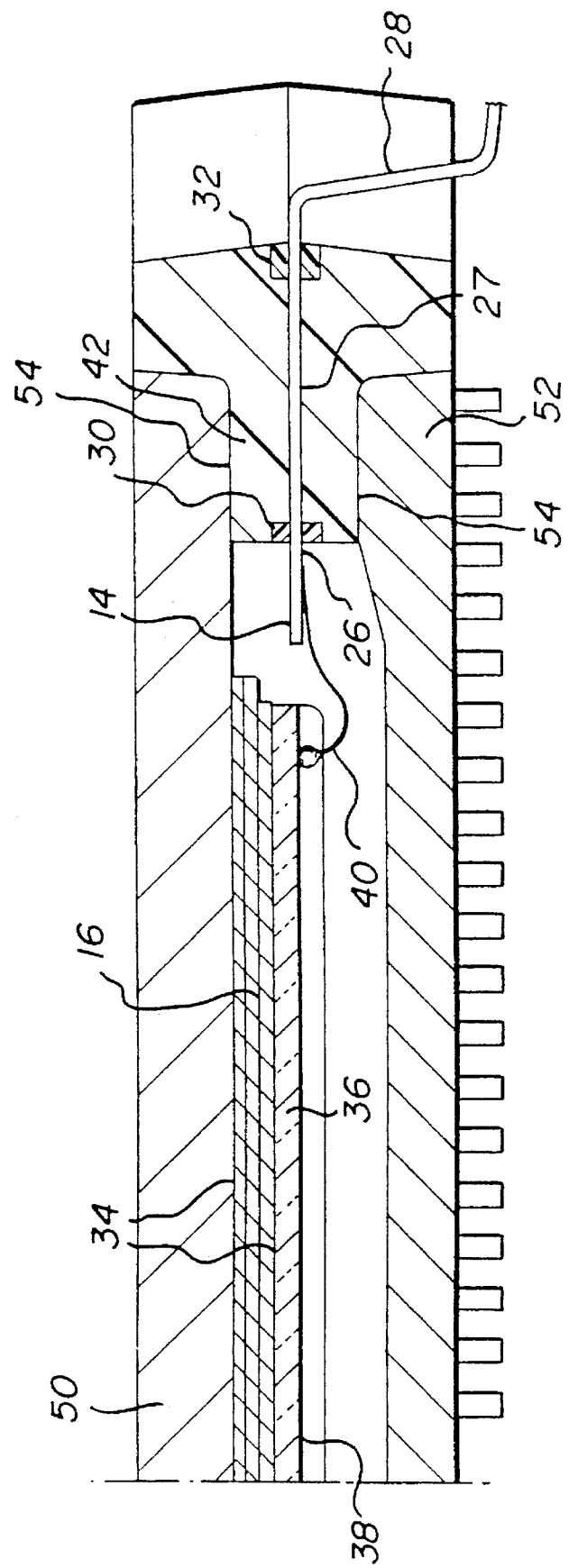
FIG. 2 depicts a partial cross-sectional view of an IC device according to the present invention.

FIG. 2 depicts an assembled IC device. A chip 36 is mounted on bar pad 16 by adhesive 34, e.g., epoxy. Chip 36 may be a semiconductor chip, silicon wafer, or the like. Other IC devices also may be used as chip 36. If an epoxy is used as adhesive 34, a cure process may involve heating the epoxy at various temperatures for varying lengths of time. For example, the epoxy may be cured by heating it according to the following schedule: about 45 minutes at about 212° F. (100° C.), about 1.25 hours at about 302° F. (150° C.), and finally, about 0.8 hours at about 527° F. (275° C.).

Once chip 36 is in properly mounted, its bond pads (not shown) are wire bonded to leads 14. A wire bond 40 connects chip 36 to each of the plurality of leads 14. Wire bond 40 may be gold, copper, or silver. Other electrically conductive metals may also be used. Wire bonding may be performed at about 554 ° F. (290° C.) for about two minutes. Once wire bonding is complete, a silicon overcoat 38 may be applied to chip 36. Silicon overcoat 38 provides protection from moisture.

Before (or after) wire bonding chip 36 to leads 14, a cavity mold 42 may be molded, e.g., injection molded, onto lead frame 10 to overlap inner strip 30 and outer strip 32 (FIG. 2). A cavity molding polymer may be injected over strips 30 and 32 at a temperature of about 338° F. (170° C.) and at a pressure of about 120 PSI for about 1.25 minutes. Once the polymer has been injected in the mold, a post-molding curing process is performed for about four hours at about 347° F. (175° C.) to solidify the cavity mold plastic. Cavity mold 42 may be plastic or another polymer and forms a support structure around chip 36.

As seen in FIG. 2, lead 14 includes inner lead portion 26 disposed toward bar pad 16, a middle lead portion 27, and an outer lead portion 28 disposed at the farthest points from bar pad 16. Inner and outer strips 30 and 32 inhibit tile flow of the polymer injected to form cavity mold 42, so that the cavity mold polymer is inhibited from seeping from middle lead portion 27 toward inner lead portion 26 or outer lead portion 28. Because the flow of cavity mold polymer is inhibited, a proper electrical connection may be formed between the bond pads of chip 36 and inner lead portion 26 via wire bond 40, such as by soldering or the like.

After assembly of these basic components of an IC device, a heat spreader 50 may be attached to the top of the IC device by an adhesive 54. Heat spreader 50 may be aluminum and may serve to cool the device during operation. Adhesive 54 may be an epoxy, for example, and may be cured by the epoxy cure process described above. On the underside of the IC device, a lid 52 may be provided which also may be attached to cavity mold 42 by an adhesive 54. Lid 52 may comprise a double plastic lid, a double aluminum lid, a glass lid for an EPROM, or a heat sink, for example.

Thus, the present invention is a method for providing continuous narrow strips (1) to bond the leads together during the assembly process and (2) to constrain cavity mold polymer to proper portions of lead 14 during the cavity mold injection process. Further, an IC device is provided having continuous strips 30 and 32 of electrically non-conductive photoresist which blocks the flow of cavity mold polymer from middle lead portion 27.

Although an embodiment has been described in detail, it is understood that various changes, substitutions, and alterations may be made herein by one skilled in the art without departing from the spirit and scope of the present invention as defined by the following claims.

What is claimed is:

1. An integrated circuit device comprising:
   a lead frame comprising a plurality of leads; said leads comprising an inner lead portion, a middle lead portion, and an outer lead portion;
   a photoresist comprising an inner strip disposed across said plurality of leads between said inner lead portion and said middle lead portion; and an outer strip disposed across said plurality of leads between said outer lead portion and said middle lead portion; and
   a cavity mold covering a portion of said plurality of leads and said photoresist.

2. An integrated circuit device comprising:
   a lead frame comprising a plurality of leads; said leads comprising an inner lead portion, a middle lead portion, and an outer lead portion;
   a photoresist comprising an inner strip disposed across said plurality of leads between said inner lead portion and said middle lead portion; and an outer strip disposed across said plurality of leads between said outer lead portion and said middle lead portion;
   a cavity mold molded from a polymer covering said inner and outer strips and said middle lead portion, whereby said inner and outer strips inhibit said cavity mold polymer from seeping onto said inner lead portion and said outer lead portion.

3. An integrated circuit device comprising:
   a lead frame comprising a plurality of leads; said leads comprising an inner lead portion, a middle lead portion, and an outer lead portion;
   a photoresist comprising an inner strip disposed across said plurality of leads between said inner lead portion and said middle lead portion; and an outer strip disposed across said plurality of leads between said outer lead portion and said middle lead portion;
   a bar pad disposed in said lead frame;
   a cavity molded from a polymer covering said inner and outer strips and said middle lead portion, such that said inner and outer strips inhibit said cavity mold polymer from seeping onto said inner lead portion and said outer lead portion;
   a chip mounted on said bar pad; and
   a plurality of wire bonds, each wire bond connecting a bond pad of said chip to one of said plurality of leads.

4. An integrated circuit device comprising:
   a lead frame including a bar pad and a plurality of leads, each lead comprising an inner lead portion disposed toward said bar pad, a middle lead portion, and an outer lead portion disposed away from said bar pad;
   first and second strip portions of photoresist material covering said plurality of leads; said strip portions being disposed across said leads with said first strip portion being disposed between said inner lead portions and said middle lead portions and said second strip portion being disposed between said outer lead portions and said middle lead portions, and said middle lead portions being left uncovered by said photoresist;
   a polymer cavity mold formed over said middle lead portions;
   a semiconductor chip mounted on said bar pad; and
   wires bonding said semiconductor chip to said leads.

5. The integrated circuit device of claim 4, wherein said photoresist material is a developed photoimagable dryfilm soldermask photoresist material.

6. A semiconductor device comprising:
   a lead frame including a plurality of spaced leads; each of said leads having an inner portion for receiving a wire bond from a semiconductor chip, an outer portion for joining said semiconductor device to an external component, and a middle portion connecting said inner and outer portions; and
   an electrically non-conductive photoresist material applied to said lead frame to form a first continuous strip of said photoresist material disposed on said leads and joining said leads between said inner portions and said middle portions, and a second continuous strip of said photoresist material disposed on said leads and joining said leads between said outer portions and said middle portions; said middle portions being left uncovered by said photoresist.

7. The semiconductor device of claim 6, further comprising a semiconductor chip; a plurality of wire bonds joining said inner portion of each of said leads to said semiconductor chip; and a cavity mold molded over said middle portions and overlapping said photoresist material.

* * * * *